(12) United States Patent
Uchiyama et al.

(10) Patent No.: US 8,164,069 B2
(45) Date of Patent: Apr. 24, 2012

(54) LUMINOUS BODY, ELECTRON BEAM DETECTOR USING THE SAME, SCANNING ELECTRON MICROSCOPE, AND MASS ANALYSIS DEVICE

(75) Inventors: Shoichi Uchiyama, Hamamatsu (JP); Yasufumi Takagi, Hamamatsu (JP); Minoru Niigaki, Hamamatsu (JP); Minoru Kondo, Hamamatsu (JP); Itaru Mizuno, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/987,341

(22) Filed: Jan. 10, 2011

(65) Prior Publication Data
US 2011/0101219 A1 May 5, 2011

Related U.S. Application Data

(63) Continuation of application No. 11/547,807, filed as application No. PCT/JP2005/006870 on Apr. 7, 2005, now Pat. No. 7,910,895.

(30) Foreign Application Priority Data

Apr. 8, 2004 (JP) ................................ P2004-114596

(51) Int. Cl.
*H01J 37/244* (2006.01)
(52) U.S. Cl. ........ 250/397; 250/310; 250/311; 250/399; 250/492.2; 257/10; 257/290
(58) Field of Classification Search .................. 250/310, 250/311, 399, 492.2, 397; 257/290, 10
See application file for complete search history.

(56) References Cited

U.S. PATENT DOCUMENTS

| 4,802,181 | A | | 1/1989 | Iwata |
| 5,296,699 | A | | 3/1994 | Deveaud-Piedran et al. |
| 5,510,627 | A | | 4/1996 | Snow |
| 5,703,373 | A | * | 12/1997 | Peckerar et al. ........... 250/491.1 |
| 6,054,718 | A | | 4/2000 | Dodd et al. |
| 6,399,966 | B1 | * | 6/2002 | Tsuda et al. .................. 257/103 |
| 6,861,650 | B2 | * | 3/2005 | Kondo et al. ............... 250/315.3 |
| 7,030,388 | B2 | * | 4/2006 | Takagi et al. ................. 250/397 |
| 2002/0166965 | A1 | | 11/2002 | Matsuda et al. |
| 2003/0131796 | A1 | * | 7/2003 | Kawashima .................. 118/726 |
| 2004/0061054 | A1 | * | 4/2004 | Kondo et al. ................. 250/310 |

FOREIGN PATENT DOCUMENTS

EP 1 365 260 11/2003
(Continued)

*Primary Examiner* — Jack Berman
*Assistant Examiner* — Michael Logie
(74) *Attorney, Agent, or Firm* — Drinker Biddle & Reath LLP

(57) ABSTRACT

A light-emitting body of rapid speed of response and high light emission intensity, and an electron beam detector, scanning electron microscope and mass spectroscope using this are provided. In the light-emitting body 10 according to the present invention, when fluorescence is emitted by a nitride semiconductor layer 14 formed on one face 12*a* of a substrate 12 in response to incidence of electrons, at least some of this fluorescence is transmitted through this substrate 12, whereby that fluorescence is emitted from the other face 12*b* of the substrate. The response speed of this fluorescence is not more than μsec order. Also, the intensity of emission of this fluorescence is almost identical to that of a conventional P47 phosphor. Specifically, with this light-emitting body 10, a response speed and light emission intensity are obtained that are fully satisfactory for application to a scanning electron microscope or mass spectroscope. In addition, a cap layer 16 contributes to improvement in the persistence rate of light emission in the nitride semiconductor layer 14, so, with this light-emitting body 10, not only high-speed response and high light emission intensity are obtained, but also an excellent persistence rate.

9 Claims, 9 Drawing Sheets

FOREIGN PATENT DOCUMENTS

| | | |
|---|---|---|
| JP | 03-233977 | 10/1991 |
| JP | 2001-308380 | 11/2001 |
| JP | 2003-179263 | 6/2003 |
| JP | 2003-347681 | 12/2003 |
| JP | 2004-63537 | 2/2004 |
| JP | 2004-131567 | 4/2004 |
| WO | WO 02/061458 | 8/2002 |

* cited by examiner

*Fig.9*

| | RESPONSE SPEED | LIGHT EMISSION INTENSITY | LIFE PROPERTY | LIGHT EMISSION WAVELENGTH | DETECTOR |
|---|---|---|---|---|---|
| GaN CRYSTAL | × | ○ | ◎ | 550nm | BI-ALKALI |
| P47 | × | ◎ | — | 430nm | BI-ALKALI |
| PLASTIC SCINTILLATOR | △ | ◎ | × | — | BI-ALKALI |
| YAP | × | ◎ | — | — | BI-ALKALI |
| GaAsP CRYSTAL | ◎ | △ | — | 720nm | MULTI-ALKALI |

# LUMINOUS BODY, ELECTRON BEAM DETECTOR USING THE SAME, SCANNING ELECTRON MICROSCOPE, AND MASS ANALYSIS DEVICE

This is a continuation application of application Ser. No. 11/547,807, having a §371 date of Sep. 6, 2007 now U.S. Pat. No. 7,910,895, which is a national stage filing based on PCT International Application No. PCT/JP05/006870, filed on Apr. 7, 2005. The application Ser. No. 11/547,807 is incorporated by reference herein in its entirety.

TECHNICAL FIELD

The present invention relates to a light-emitting body that emits light in response to incidence of electrons, an electron beam detector, a scanning electron microscope and a mass spectroscope using the light-emitting body.

BACKGROUND ART

Conventional electron beam detectors, when measuring an electron beam of strong intensity, perform detection of the electron beam by measuring the current value produced by the electron beam, but, in the case of measurement of an electron beam of comparatively low intensity, the amount of charge produced by the electron beam is small, so it is not possible to detect the electron beam efficiently. Accordingly, in the case of an electron beam detector used in for example a scanning electron microscope (SEM), measurement is conducted by irradiating a sample surface with the electron beam, collecting the secondary electrons generated at this sample surface and using these to irradiate a phosphor, and detecting the fluorescence generated by this phosphor using a photomultiplier tube (photodetector). As such phosphors, the various types of phosphor shown in FIG. 9 are known; this table shows the phosphor, response speed, light emission intensity, life performance, light emission wavelength, and material (photoelectric surface) of the fluorescence detector. The order of excellence in this table is indicated by the symbols: double circle, circle, triangle, and cross.

In recent years, in the field of scanning electron microscopes or mass spectroscopes, phosphors are being demanded that provide high light emission intensity and fast response speed. The reason for this is that for example in the case of a scanning electron microscope, if the speed of response of the phosphor is fast, the scanning speed can consequently be made fast, making it possible to improve the performance of the equipment.

Patent reference 1: International Laid-open Patent Application No. 02/061458 pamphlet However, in the case of a conventional phosphor as shown in FIG. 9, there was the problem that it was difficult to obtain a fast response speed (of the order of µsec) sufficient for a scanning electron microscope or mass spectroscope. It should be noted that, of the small number of phosphors with which a good response speed is obtained, GaAsP light-emitting bodies have a low intensity of light emission and so were unsuitable for application to scanning electron microscopes and the like.

DISCLOSURE OF THE INVENTION

The present invention was made in order to solve the problem described above, its object being to provide a light-emitting body of fast response speed and high intensity of light emission, and an electron detector, a scanning electron microscope and mass spectroscope using this.

In a light-emitting body that emits fluorescence in response to incidence of electrons, a light-emitting body according to the present invention comprises a substrate, a nitride semiconductor layer having a quantum well structure formed on one of the faces of the substrate, and a cap layer having an electron incidence face that is formed on the nitride semiconductor layer. Specifically, this light-emitting body is a light-emitting body that converts incident electrons to fluorescence and comprises: a substrate that is transparent to this fluorescence; a nitride semiconductor layer having a quantum well structure that emits fluorescence in response to incidence of electrons, that is formed on one of the faces of the substrate; and a cap layer that is formed of material of larger band gap energy than the constituent material of the nitride semiconductor layer.

In this light-emitting body, when the nitride semiconductor layer formed on one face of the substrate emits fluorescence in response to incidence of electrons, at least some of the fluorescence passes through the substrate and is emitted from the other face of the substrate. This fluorescence is caused by recombination of pairs of electrons and positive holes that are formed by incidence of electrons onto the quantum well structure of the nitride semiconductor layer and its response speed is of µsec order or less. Also, the intensity of light emission of this fluorescence is of the same order as a conventional P47 phosphor.

That is, this light-emitting body has sufficient response speed and light emission intensity for application to a scanning electron microscope or mass spectroscope. Also, the cap layer contributes to an improvement of the rate of persistence of light emission in the nitride semiconductor layer, so not only are high-speed response and high light emission intensity achieved with this light-emitting body, but also an excellent persistence rate is achieved. The "persistence rate" is a value expressing the degree to which the light emission intensity persists after lapse of a prescribed time and may be expressed for example as a percentage obtained by dividing the light emission intensity after lapse of a prescribed time by the original light emission intensity.

Also, preferably the well width of the quantum well structure is not more than 4 nm. In this case, a light-emitting body that emits fluorescence of at least the desired amount can be obtained.

Also, the thickness of the cap layer is preferably not more than 10 nm. In this case, the response speed of the light-emitting body as a whole is improved by reducing the light emission component of the cap layer.

Also, preferably the nitride semiconductor layer is constituted of InGaN and GaN, and the cap layer is constituted of AlGaN. In this case, the cap layer is constituted of a material of larger band gap energy than the constituent material of the silicon nitride semiconductor layer.

Also, preferably there is further provided a reflective film laminated on the cap layer. In this case, the persistence rate may be further improved by this reflective film.

Also, preferably the thickness of the reflective film is at least 800 nm. In this case, a better persistence rate can be obtained.

An electron beam detector according to the present invention is characterized by the provision of the light-emitting body and a photodetector having sensitivity for fluorescence emitted by this light-emitting body.

In this electron beam detector, measurement of an electron beam is performed by directing the fluorescence emitted from a light-emitting body as described above onto the optical incidence face of a photodetector. Specifically, measurement of the electron beam is performed by means of the fluorescence, which is produced with the fully sufficient response speed and light emission intensity that is required. Also, since the light-emitting body has an excellent persistence rate, the life performance in this electron detector is significantly improved. Also, by employing this electron beam detector in a scanning electron microscope or mass spectroscope; the performance of this microscope etc can be improved.

A scanning electron microscope according to the present invention is characterized in that it comprises: an electron beam detector comprising the light-emitting body and a photodetector having sensitivity for the fluorescence emitted by this light-emitting body; and a vacuum chamber wherein at least the light-emitting body is arranged, and in that an image of a sample is picked up by scanning the surface of the sample arranged in the vacuum chamber with the electron beam, whereby directing the secondary electrons generated from the sample onto the electron detector and then correlating the scanning position of the sample and the output of the electron beam detector.

A mass spectroscope according to the present invention is characterized in that it comprises an electron beam detector comprising the light-emitting body and a photodetector having sensitivity for the fluorescence emitted by this light-emitting body; a vacuum chamber wherein at least the light-emitting body is arranged; a separating section for separating in spatial or time-wise fashion the ions generated from a sample in the vacuum chamber in accordance with their mass; and a dynode that is irradiated with the ions separated by the separating section, secondary electrons generated from the dynode in response to incidence of ions on the dynode being directed to the electron detector, mass spectroscopy of the sample being performed from the output of the electron beam detector.

According to the present invention, a light-emitting body of fast response speed and high light emission intensity and an electron beam detector, a scanning electron microscope and mass spectroscope using this are provided.

BRIEF DESCRIPTION OF THE DRAWINGS

FIG. 9 is a table showing the properties of a conventional phosphor.

Figure 1:
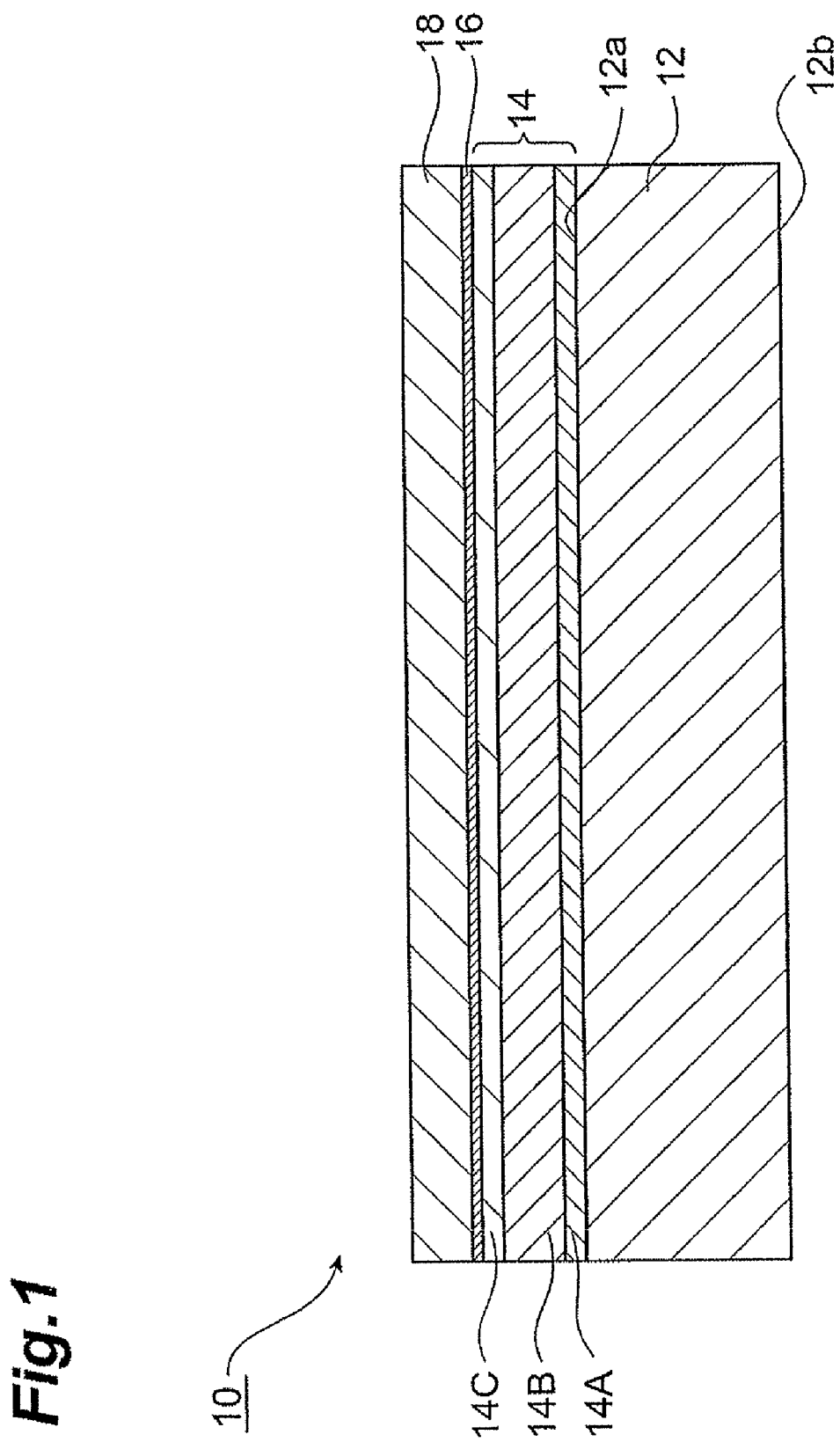
FIG. 1 is a cross-sectional view showing a light-emitting body according to an embodiment of the present invention.

10 light-emitting body
12 substrate
14 nitride semiconductor layer
16 cap layer
18 metal backing layer
20 electron beam detector
22 optical member
30 photodetector
AZ separating section
DY1, DY2 dynode
e1, e2, e3 electron beam
I light incident face
SM sample.

DESCRIPTION OF THE PREFERRED EMBODIMENTS

A mode that is believed to be optimum in implementation of a light-emitting body, and an electron beam detector, a scanning electron microscope and mass spectroscope using this according to the present invention are described below in detail with reference to the appended drawings. Elements which are the same or similar are indicated by the same reference symbols and where the description would be duplicated such description is dispensed with.

As shown in FIG. 1, a light-emitting body 10 comprises a base 12, a nitride semiconductor layer 14 formed on the substrate surface 12a, a cap layer 16 and metal backing layer (reflective film) 18 successively laminated on the nitride semiconductor layer 14. Attracted by the positive potential applied to the metal backing layer 18, electrons are directed onto the metal backing layer 18. Since the metal backing layer 18 has a thickness capable of transmitting electrons, electrons are incident on the interface (electron incidence face) between the metal backing layer 18 and the cap layer 16 and enter into the interior.

The material of the substrate 12 is an insulator of extremely large band gap energy being made of transparent sapphire (alumina: $Al_2O_3$), which is of low absorption rate for light of wavelength of 170 nm or more. Specifically, the insulating substrate 12 has the property of transmitting light of wavelengths of about 170 nm or more. The nitride semiconductor layer 14 is a three-layer structure in which, from the side of the substrate 12, a buffer layer 14A of $In_xGa_{1-x}N$ ($0 \leq x \leq 1$), a GaN layer 14B doped with Si, and a quantum well structure layer 14C of InGaN/GaN are successively laminated. This InGaN/GaN quantum well structure layer 14C is a layer having a quantum well structure constituted by InGaN and GaN, and emits fluorescence of wavelength about 415 nm when irradiated by an electron beam. Specifically, when an electron beam is incident that reaches the quantum well structure 14C, electron/positive hole pairs are formed, and fluorescence is emitted by the process of recombination of these in the quantum wells.

Thus, at least the portion of this fluorescence that is of longer wavelength than 170 nm passes through the substrate 12 and is emitted from the rear face (substrate rear face) 12b of the substrate surface 12a. It should be noted that the "quantum well structure" referred to in the present specification, apart from an ordinary quantum well structure, includes a quantum wire structure or quantum dot structure. Also, in this specification, a "nitride semiconductor" is a chemical compound including at least one of Ga, In, or Al as group III element and including N as the main group V element.

Figure 2:
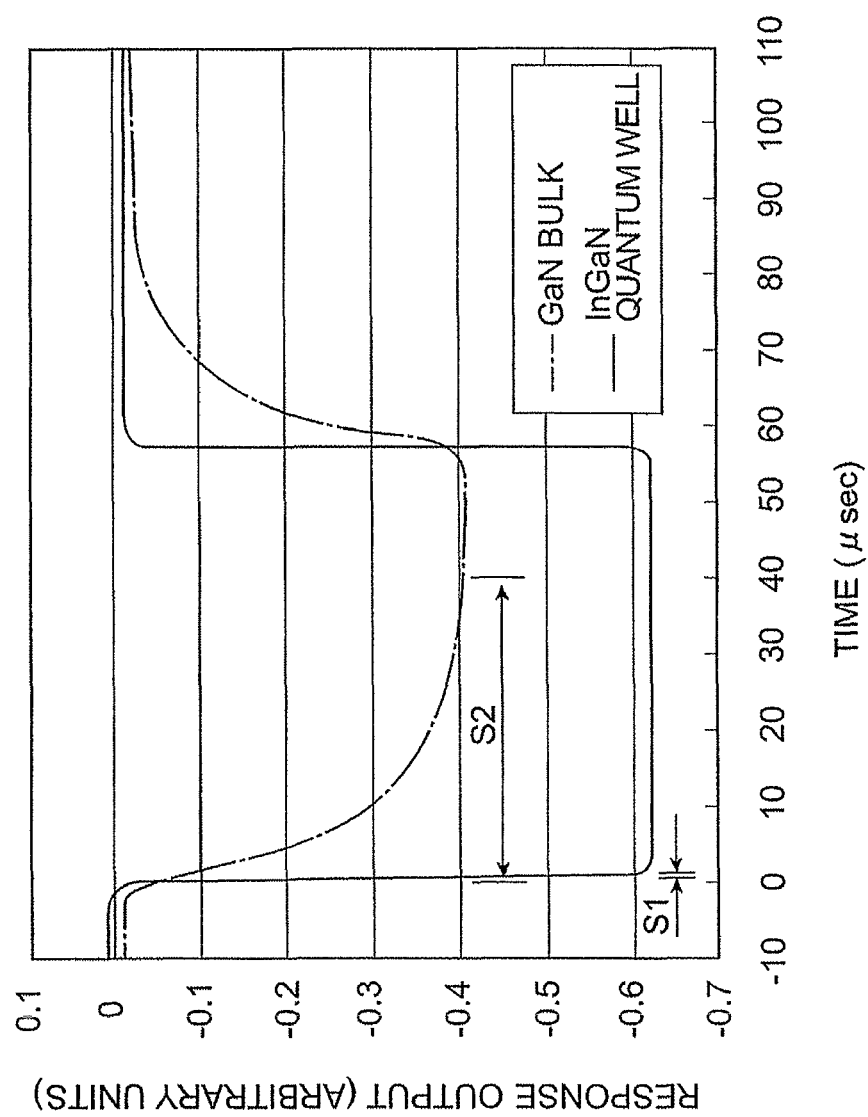
FIG. 2 is a graph showing the response characteristic of a light-emitting body having an InGaN/GaN quantum well structure.

Next, the quantum well structure 14C of the nitride semiconductor layer 14 will be described. FIG. 2 is a graph showing the response characteristic of light emission of a light-emitting body having an InGaN/GaN quantum well structure and likewise showing a graph of the response characteristic of a GaN light-emitting body of the conventional bulk structure for comparison. The horizontal axis of the graph of FIG. 2 is the time (μsec) and the vertical axis shows the magnitude (arbitrary constant) of the response output when an electron beam in the form of a pulse is incident in the vicinity of time 0.

It can be seen from this graph that in the response characteristic of the InGaN/GaN quantum well structure layer 14 C, the response speed S1 (width of inclination of the graph) of a light-emitting body having an InGaN/GaN quantum well structure is of nsec order, whereas the response speed S2 of a GaN light-emitting body of bulk structure is of 10 μsec order. The reason why the response speed of a light-emitting body having such an InGaN/GaN quantum well structure is faster than that of a GaN light-emitting body of bulk structure is believed to be that in the case of a light-emitting body having an InGaN/GaN quantum well structure inter-band light emission is dominant whereas in the case of a GaN light-emitting body of bulk structure deep-layer light emission is dominant.

Figure 3:
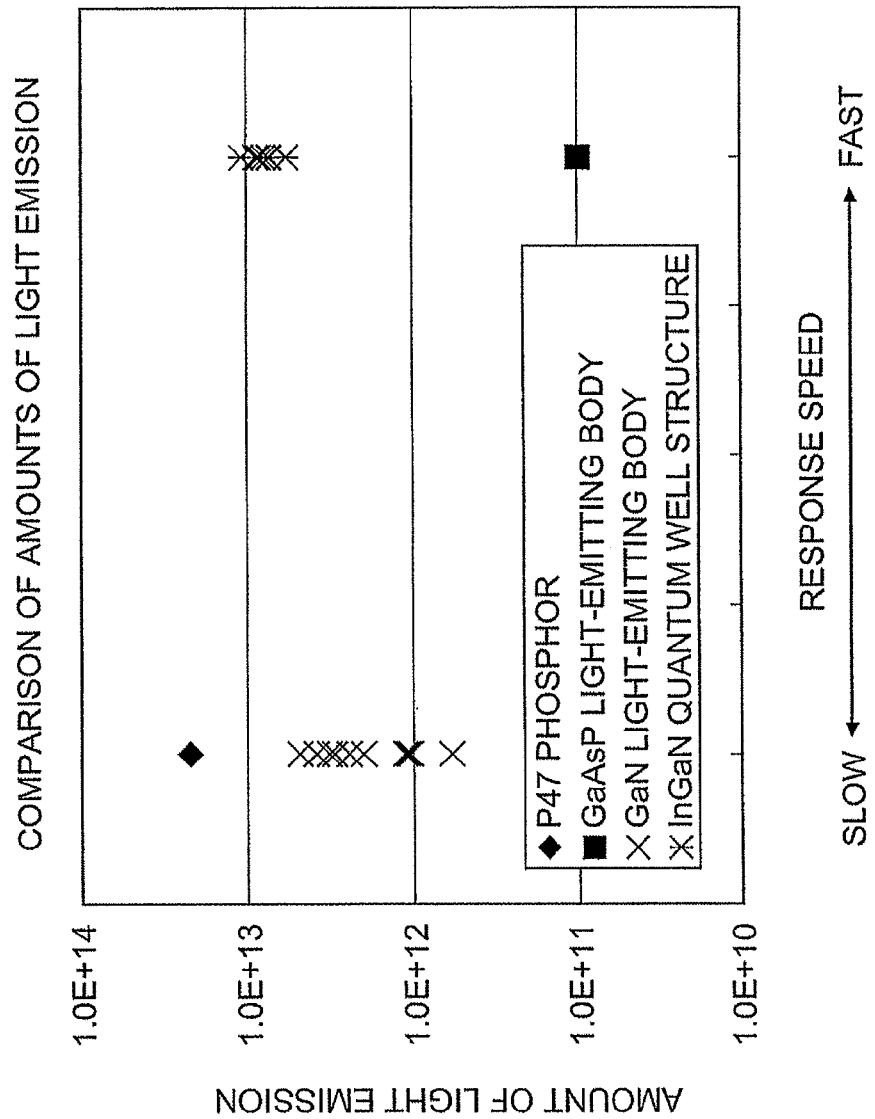
FIG. 3 is a graph comparing the amount of light emitted by a light-emitting body having an InGaN/GaN quantum well structure and a conventional light-emitting body.

Also, the amount of light emitted by the fluorescence emitted from a light-emitting body having an InGaN/GaN quantum well structure was measured and a comparison (see FIG. 3) of amount of light emitted (arbitrary units) with a conventional light-emitting body was made. As a result, it was found that the amount of light emitted (average about $7.20 \times 10^{12}$) by a light-emitting body having an InGaN/GaN quantum well structure was considerably larger than the amount of light emitted (average about $4.81 \times 10^{12}$) by a GaN light-emitting body of bulk structure, and of about the same order as the amount of light emitted by a P47 light-emitting body of large amount of light emission. Also, it was found that, compared with the amount of light emitted ($9.8 \times 10^{10}$) by a GaAsP light-emitting body with which a good response characteristic was obtained, the light emission intensity was nearly 100 times better.

Returning to FIG. 1, the cap layer 16 of the light-emitting body 10 is of thickness 10 nm and is constructed of $Al_xGa_{1-x}N$ ($0 \leq x \leq 1$). This AlGaN that is used to construct the cap layer 16 has a band gap energy that is larger than that of the InGaN or GaN used to construct the InGaN/GaN quantum well structure layer 14C. Consequently, the pairs of electrons and positive holes that are generated in the quantum well structure layer 14C are efficiently fed to the quantum wells. That is, by adopting this cap layer 16, recombination of the electrons and positive holes in the quantum well structure 14C is facilitated. Consequently, the brightness (amount of light emitted) is significantly improved compared with the conventional light-emitting body, which has no cap layer 16.

Also, this efficient feeding of the electrons and positive hole pairs generated in the quantum well structure layer 14C to the quantum wells enables the period of continuance of recombination of electrons and positive holes to be extended. Consequently, in the case of this light-emitting body 10, the light emission intensity continues for a longer time than in the case of a conventional light-emitting body, which has no cap layer 16. That is, with the light-emitting body 10, the persistence rate, which is a value indicating the degree to which the intensity of light emission persists after lapse of a prescribed time, is improved. Furthermore, as a result of meticulous study, the inventors discovered that, by making this cap layer 16 of small thickness, it was possible to significantly reduce the light emission component (light emission component in the vicinity of 550 nm) of the cap layer light emission, thereby improving the response speed of the light-emitting body as a whole. The thickness of the cap layer 16 is therefore preferably not more than 10 nm.

The metal backing layer 18 is of thickness 800 nm and is constructed of Al. By means of this metal backing layer 18, further improvement in the persistence rate of the light-emitting body 10 can be achieved.

Figure 4:
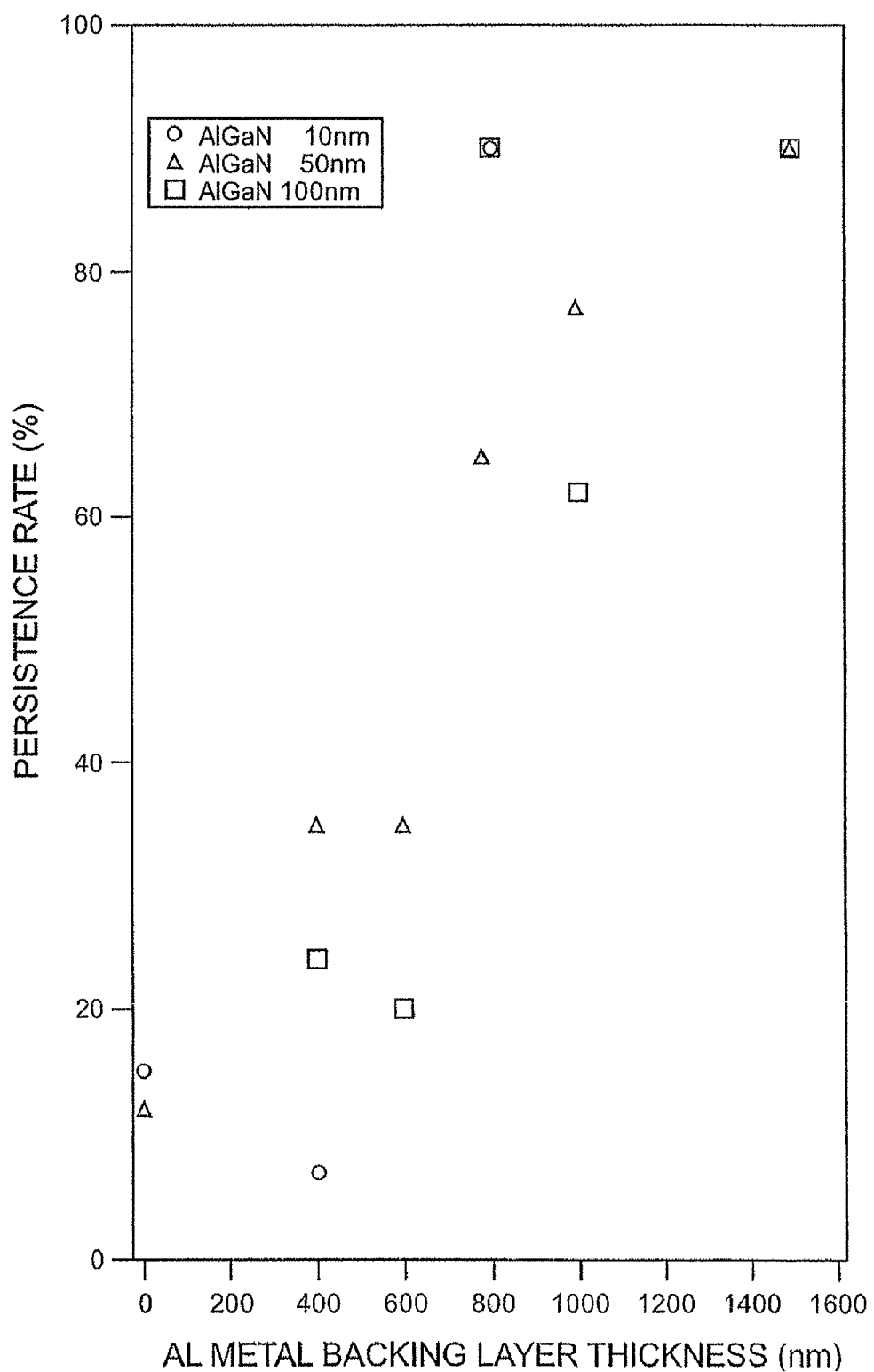
FIG. 4 is a graph showing the relationship between metal backing layer thickness and persistence rate for various cap layer thicknesses.

The relationship between the cap layer thickness and the metal backing layer thickness will now be described with reference to FIG. 4. FIG. 4 is a graph showing the relationship between the metal backing layer thickness (nm) and the persistence rate (percentage obtained by dividing the light emission intensity after the lapse of eight hours by the original light emission intensity). From this graph, it can be seen that the persistence rate tends to improve as the thickness of the metal backing layer is increased. Also, it can be seen that if the thickness of the metal backing layer is 800 nm or more, there is a marked increase in the persistence rate. That is, it is preferable that the thickness of the metal backing layer 18 should be at least 800 nm. In particular, if the cap layer 16 is 10 nm and the metal backing layer 18 is 800 nm, both high-speed response and a high persistence rate (about 90%) can be achieved.

As described above, the inventors discovered that, with a light-emitting body having an InGaN/GaN quantum well structure, a faster response speed can be achieved than in the case of a conventional GaN substrate of bulk structure. Also, they discovered that the amount of light emitted (light emission intensity) by a light-emitting body having an InGaN/GaN quantum well structure is larger than (or similar to) the amount of light emitted by a conventional bulk structure GaN light-emitting body or P47 phosphor. Also, both the response speed and light emission intensity of a light-emitting body having an InGaN/GaN quantum well structure are fully sufficient for use in a scanning electron microscope or mass spectrometer. That is, a light-emitting body 10 comprising a nitride semiconductor layer 14 having an InGaN/GaN quantum well structure layer 14C can be the to be a light-emitting body that is much more suitable as a light-emitting body for use in a scanning electron microscope or mass spectroscope than conventional light-emitting bodies. Also, by adoption of a cap layer 16 and metal backing layer 18, an excellent persistence rate of the light-emitting body 10 can be achieved.

Figure 5:
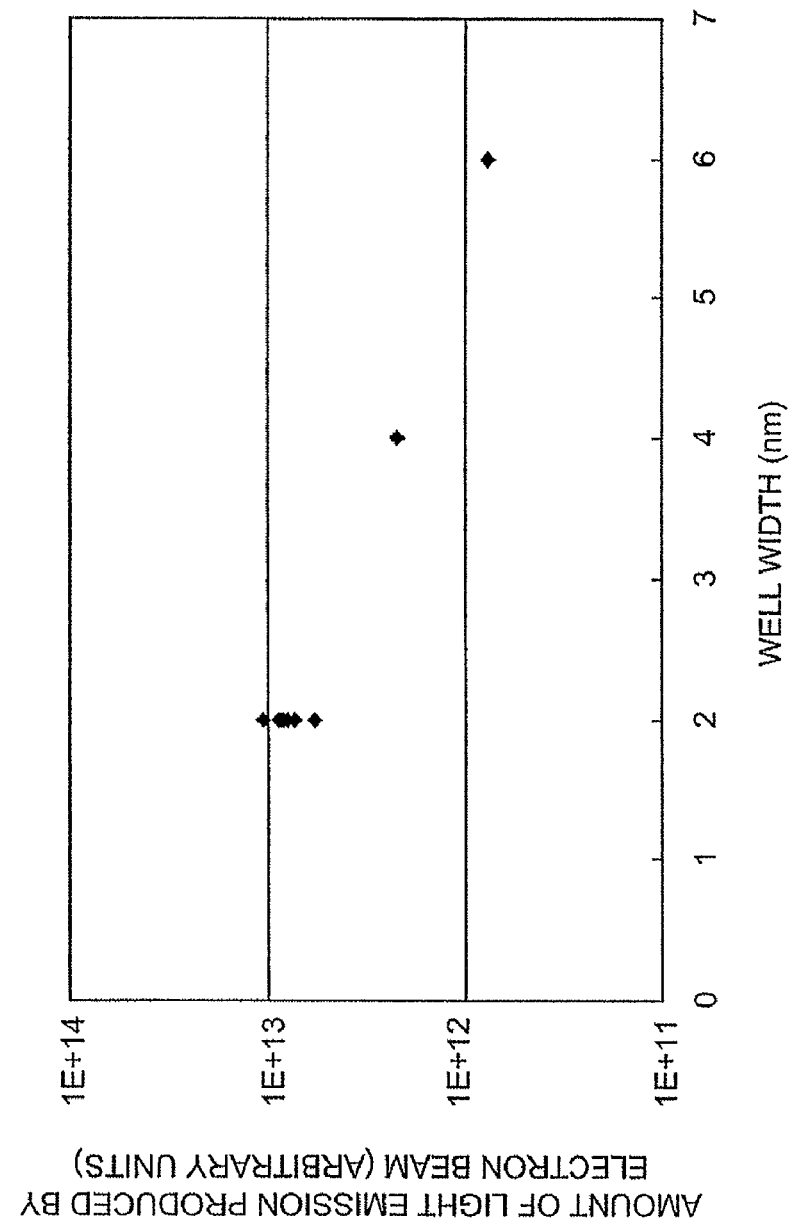
FIG. 5 is a graph showing the relationship between well width and amount of light emitted by a light-emitting body having an InGaN/GaN quantum well structure.

It should be noted that, in the InGaN/GaN quantum well structure of the nitride semiconductor layer 14, preferably the well width of the quantum wells is not more than 4 nm. FIG. 5 is a graph showing the relationship between the well width of the quantum well structure of InGaN/GaN of the nitride semiconductor layer 14 and the light emission intensity. The horizontal axis of the graph of FIG. 5 is the well width (nm) and the vertical axis is the amount of light emitted (arbitrary units) when irradiated with an electron beam of a prescribed amount. From this Figure, it can be seen that, whereas the amount of light emitted is smaller than $1 \times 10^{12}$ when the well width is 6 nm, when the well width is not more than 4 nm, the amount of light emission is in each case at least $1 \times 10^{12}$. That is, by making the well width of the quantum well structure not more than 4 nm, an amount of light emission of at least $1 \times 10^{12}$ can be achieved, thereby making it possible to obtain fluorescence that is ideal for practical use from the light-emitting body 10.

Also, regarding the combinations of materials of the substrate 12 and quantum well structure layer 14C, various other combinations apart from sapphire and InGaN/GaN quantum well structure are possible: these combinations are described below. Table 1 shows substrates that are suitable for the material of the substrate 12.

TABLE 1

| Substrate material | Transmission wavelength [nm] | [eV] |
| --- | --- | --- |
| GaN | 366 | 3.39 |
| AlN | 200 | 6.2 |
| LiAlO$_2$ (LAO) | 191 | 6.5 |
| LiGaO$_2$ (LGO) | 221 | 5.6 |
| ZnO | 368 | 3.37 |
| 6H—SiC | 409 | 3.03 |
| 4H—SiC | 380 | 3.26 |
| α-Al$_2$O$_3$ (sapphire) | 170 | — |
| MgO | 200 | — |
| MgAl$_2$O$_4$ | 200 | — |

The materials shown in Table 1 are materials of comparatively short transmission wavelength and include materials (for example AlN) that transmit light of the entire visible optical region.

Also, the material of the quantum well structure layer 14C can be suitably selected from nitride semiconductors having a quantum well structure constituted by In$_x$Al$_y$Ga$_{1-x-y}$N (x≦1, y≦1, x+y≦1) and In$_a$Al$_b$Ga$_{1-a-b}$N (a≦1, b≦1, a+b≦1). Consequently, apart from the quantum well structure layer 14C (InGaN/GaN combination) described above, it would possible to employ for example a combination such as InGaN/AlGaN or InGaN/InGaN or GaN/AlGaN.

In the combinations of substrate material and quantum well structure layer material described above, the wavelength of the fluorescence that is emitted by the quantum well structure layer 14C must be longer than the transmission wavelength of the substrate 12. Specifically, fluorescence is emitted from the substrate rear face 12b by selecting a substrate material of transmission wavelength that is shorter than the wavelength of the fluorescence that is emitted by the quantum well structure layer 14C or by selecting a material for the quantum well structure layer 14C that emits fluorescence of wavelength longer than the transmission wavelength of the substrate 12.

Next, a method of manufacturing a light-emitting body 10 as described above will be described.

In the manufacture of a light-emitting body 10, first of all, a sapphire substrate 12 is introduced into the deposition chamber of an organic metal vapor phase deposition device (MOCVD) and heat treatment performed for five minutes at 1050° C. in an atmosphere of hydrogen, to clean the sapphire substrate surface 12a. The temperature of the substrate is then lowered to 475° C., and an InGaN buffer layer 14A of thickness 25 nm is deposited; the temperature of the substrate is then raised to 1075° C., to grow a GaN layer 14B of 2.5 μm. After this the temperature of the substrate is lowered to 800° C. to form a quantum well structure layer 14C of In$_x$Ga$_{1-x}$N (x=0.13)/GaN. The thickness (well width) of this InGaN/GaN quantum well structure 14C is 2 nm, the number of wells in the barrier layer 10 nm is 11, and the well layer and barrier layer are doped with 1.8×10$^{18}$ cm$^{-3}$ of Si. It should be noted that the number of wells is not restricted to 11, and could be suitably adjusted depending on the accelerating voltage of the incident electron beam. Also, the thickness of the barrier layer is not restricted to 10 nm and could be any thickness such that the electrons are satisfactorily enclosed in the well layer.

A cap layer 16 is then laminated on the quantum well structure layer 14C in the organic metal vapor phase deposition device. Manufacture of the light-emitting body 10 is then completed by laminating a metal backing layer 18 on the cap layer 16 by transferring to an evaporation device.

It should be noted that, although in the example described above, trimethyl gallium (Ga(CH$_3$)$_3$: TMGa) is used as the Ga source, trimethyl indium (In(CH$_3$)$_3$: Than) is used as the In source, and monosilane (SiH$_4$) is used as the Si source, other organic metal raw materials (such as for example triethyl gallium (Ga(C$_2$H$_5$)$_3$: TEGa), triethyl indium (In(C$_2$H$_5$)$_3$: TEIn) etc) and other hydrogen compounds (such as for example disilane (Si$_2$H$_4$) etc) could be employed.

It should be noted that, although in the example described above, an organic metal vapor phase deposition device was employed, it would also be possible to use a hydride vapor deposition device (HVPE) or molecular beam epitaxial (MBE) device. Also, since the deposition temperatures depend on the devices used in the tests, there is no restriction to the temperatures described above. Furthermore, although InGaN was used as an example of the buffer layer 14A, a suitable choice could be made from nitride semiconductor materials containing N as the chief group V element and including at least one or more of In, Al or Ga as group III elements for the buffer layer 14A.

Also, although the film thicknesses of the above layers and the doping amounts of the Si are not restricted to the amounts illustrated in the examples described above, the amounts described above are more suitable. Furthermore, although an example was described in which a GaN layer 14B was laminated on the buffer layer 14A in the example described above, apart from GaN, it would be possible to make a suitable selection from nitride semiconductors containing N as the chief group V element and including at least one or more of In, Al or Ga as group III elements and having a band gap that is transparent with respect to the light emission wavelength of the quantum well structure 14C. The example described above was an example in which the GaN layer 14B and InGaN/GaN quantum well structure layer 14C were doped with Si, but there is no restriction to this, and it would be possible to dope these with other impurities (such as for example Mg), or, if required, not to perform doping.

Next, an electron beam detector 20 employing a light-emitting body 10 as described above will be described.

Figure 6:
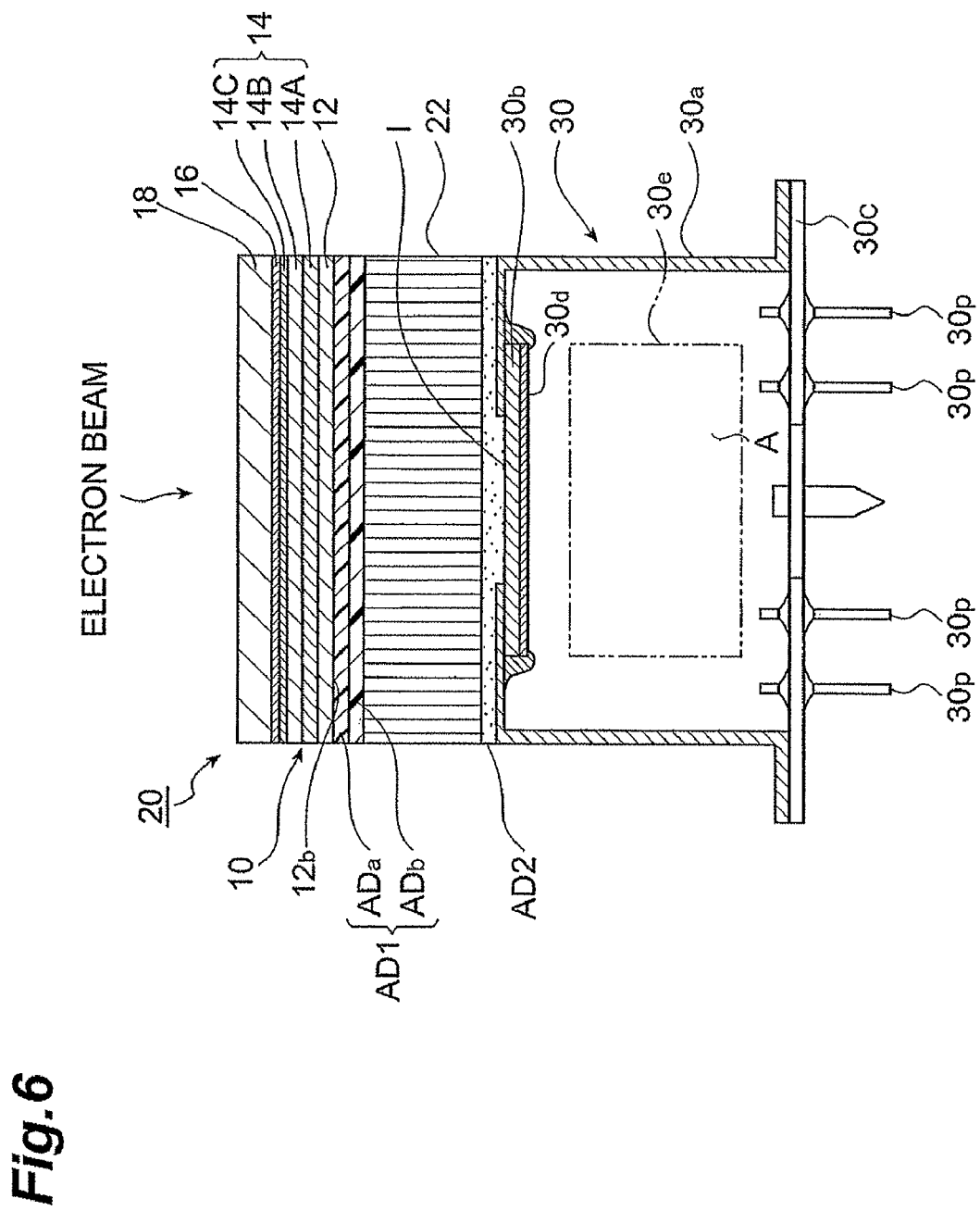
FIG. 6 is an axial cross-sectional view showing an electron beam detector according to an embodiment of the present invention.

FIG. 6 is an axial cross-sectional view of an electron beam detector 20. In this electron beam detector 20, a light-emitting body 10 that converts incident electrons to fluorescence and an light incident face I of a photodetector 30 are optically coupled through an optical member (optical guide member) 22. Also, the electron beam detector 20 is integrated by physical connection of the light-emitting body 10 and the photodetector 30 through the optical member 22. More specifically, the optical member 22, which is made of material that is transparent to the fluorescence, is stuck onto the light incident face I, and the light-emitting body 10 is mounted on this optical member 22. The optical guide member 22 may be a light guide such as an optical fiber plate (FOP), or, apart from this, could be a lens that focuses the fluorescence generated by the light-emitting body 10 onto the light incident face I.

A fluorescence-transparent adhesive layer (adhesive: resin) AD2 is interposed between the optical member 22 and the photodetector 30, so that the relative position of the optical member 22 and photodetector 30 is fixed by the adhesive layer AD2.

The optical member 22 is a glass plate and an SiN layer ADa and SiO$_2$ layer ADb are formed on the rear face 12b of the substrate of the light-emitting body 10, the SiO$_2$ layer ADb and glass plate of the optical member 22 being melt-bonded. Since the SiO$_2$ layer ADb and the glass plate are both silicified oxides, these can be melt-bonded by heating. Also, although the SiO$_2$ layer ADb is formed on the SiN layer ADa using for example a sputtering method, a high bonding force between these is achieved.

Although the SiN layer ADa is likewise formed on the surface of the light-emitting body 10 by for example a sputtering method, a high bonding force between these is achieved, so, as a result, the adhesive layer AD1 sticks the light-emitting body 10 to the optical member 22. Also, since the SiN layer ADa also functions as a reflection-preventing film, this SiN layer ADa suppresses reflection in the direction of the light-emitting body 10 of fluorescence generated in the light-emitting body 10 in response to incidence of an electron beam. The overall refractive indices of the adhesive layers AD1 and AD2 are respectively 1.5.

In an electron beam detector 20 having such a structure, fluorescence generated in the light-emitting body 10 in response to incidence of an electron beam enters the optical member 2 through the adhesive layer AD1 which is made of fluorescence-transparent material, and reaches the light incident face I of the photodetector 30 by successive transmission through the optical member 2 and adhesive layer AD2.

The photodetector 30 illustrated in this example is a photomultiplier. This photodetector 30 comprises a side tube 30a made of metal, an optical input window (faceplate) 30b that blocks the aperture at the head of the side tube 30a, and a vacuum enclosure comprising a stem plate 30c that blocks the aperture at the bottom of the side tube 30a. Within this vacuum enclosure, there are arranged a photo-cathode 30d formed on the inside face of the optical input window 30b, an electron multiplier 30e and a positive electrode A.

The optical input face I is the external face of the optical input window 30b; fluorescence that is incident at the optical input window I passes through the optical input window 30b to enter the photo-cathode 30d and the photo-cathode 30d emits (photo)electrons in the direction of the interior of the vacuum enclosure by performing photoelectric conversion in response to incidence of fluorescence. These electrons are multiplied by the electron multiplier 30e comprising a microchannel plate or mesh type dynode and are collected by the anode A.

The electrons that are collected by the anode A are extracted to outside the photodetector 30 through pinholes 30p formed through the stem plate 30c. A plurality of pinholes 30p are provided, and a prescribed potential is supplied to the electron multiplier 30e through these pinholes 30p. The potential of the metal side tube 30a is 0V, and the photo-cathode 30d is electrically connected with the side tube 30a.

In an electron beam detector 20 as described above, there is provided a light-emitting body 10 having a response speed and intensity of light emission that are fully satisfactory for application to a scanning electron microscope or mass spectroscope and having an excellent persistence rate, so high-speed response and excellent life performance can be achieved.

The electron beam detector 20 can be used in a scanning electron microscope (SEM) or mass spectroscope.

Figure 7:
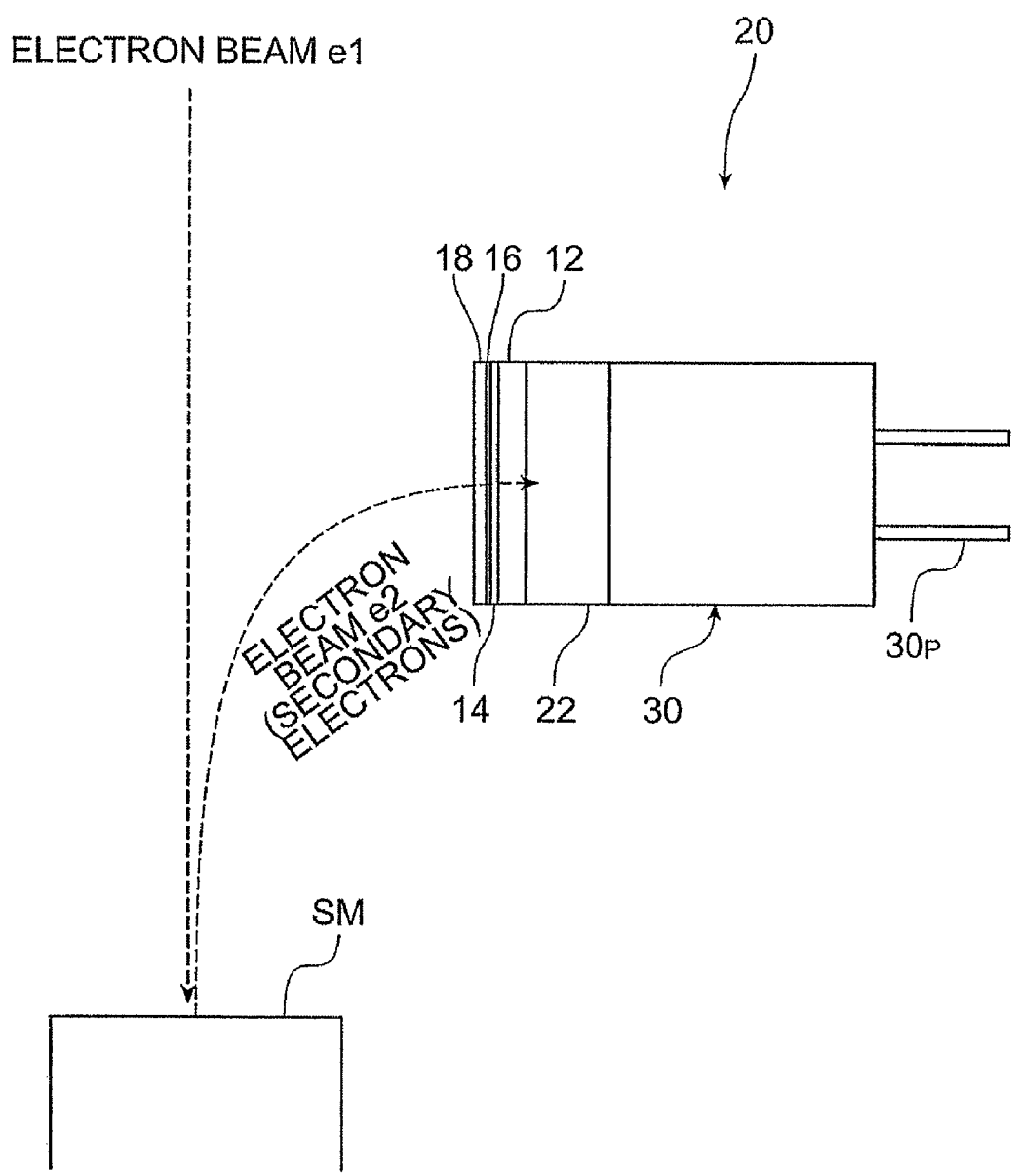
FIG. 7 is a layout diagram showing a scanning electron microscope using an electron beam detector according to FIG. 5.

FIG. 7 is a diagram given in explanation of major parts of a scanning electron microscope. The scanning electron microscope comprises the electron beam detector 20. When an electron beam e1 is directed onto a sample SM and the surface of this sample SM is scanned by this electron beam e1, secondary electrons are emitted from the surface of the sample SM and these are directed to the electron beam detector 20 as an electron beam e2. An electrical signal is output from the pin holes 30p in response to incidence of the electron beam e2.

Specifically, this scanning electron microscope is a device wherein an image of a sample SM is picked up by providing at least the light-emitting body 10 of the electron beam detector 20 within a vacuum chamber (not shown), and scanning the surface of the sample SM arranged in this vacuum tube with an electron beam e1, directing the secondary electrons generated from the sample SM by this scanning into the electron beam detector 20, and correlating in synchronized fashion the position of scanning of the electron beam e1 and the output of the electron beam detector 20. The scanning speed in this scanning electron microscope in which the electron beam detector 20 is adopted can thus be greatly increased, since the response speed of the light-emitting body 10 of the electron beam detector 20 is of nsec order. Also, since the light-emitting body 10 has an excellent persistence rate, performance such as the life property of this scanning electron microscope is significantly improved.

Figure 8:
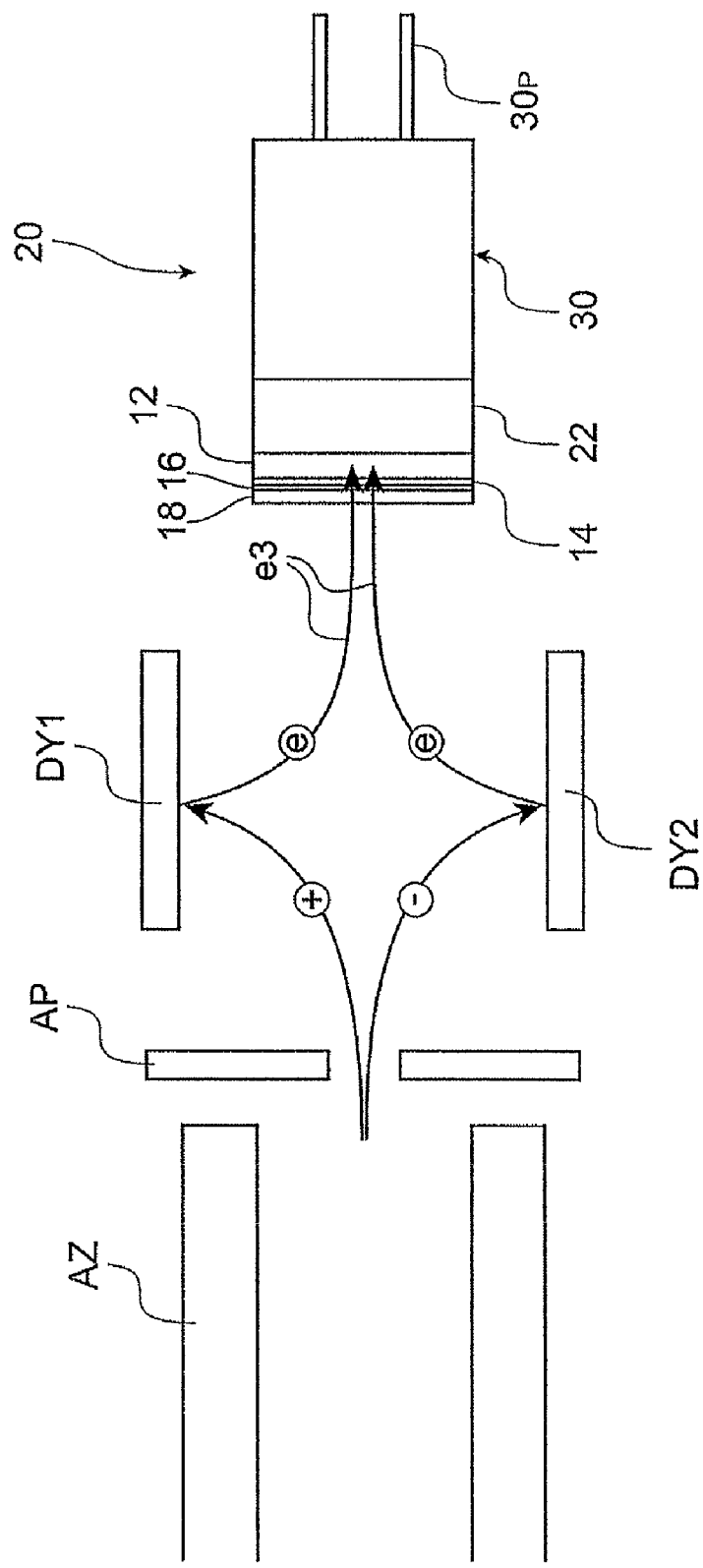
FIG. 8 is a layout diagram showing a mass spectroscope using an electron beam detector according to FIG. 5.

FIG. 8 is a diagram given in explanation of major parts of a mass spectroscope.

This mass spectroscope comprises an electron beam detector 20 as described above. When a suitable potential is supplied to the aperture AP and negative potential is applied to the first dynode DY1 positioned on the opposite side to the separating section AZ with respect to the aperture AP, positive ions located in the separating section AZ pass through the aperture AP and collide with the first dynode DY1 and secondary electrons produced by the collision are released from the surface of the first dynode DY1 and these secondary electrons are directed to the electron beam detector 20 as an electron beam e3.

It should be noted that, when negative ions are extracted from the separating section AZ by applying a positive potential to the second dynode DY2, these negative ions collide with the second dynode DY2, causing secondary electrons to be released from the surface of the second dynode DY2 due to this collision and these secondary electrons are then directed to the electron beam detector 20 as an electron beam e3. An electrical signal is then output from the pinholes 30p in response to incidence of the electron beam e3.

There are various types of mass spectroscope but in all cases ions are separated time-wise or spatially in accordance with their mass.

Assuming that the separating section AZ is a flight tube, the time of passage of the ions through the interior of the flight tube differs depending on their mass, so their arrival times at the dynode DY1 or DY2 are different; consequently, the masses of the ions can be distinguished by monitoring the change with time of the current value if that is output from the pinholes 30p. That is, this current value indicates the amount of ions of the respective masses in each time.

Assuming that the flight path of the ions changes in accordance with mass depending on the magnetic field in the separating section AZ, the ions passing through the aperture AP will be different for each mass, and this can be controlled by varying the magnetic flux density in the separating section AZ; the masses of the respective ions can therefore be distinguished by monitoring the change with time of the current value that is output from the pinholes 30p. Specifically, the amounts of ions of the respective masses are indicated in each time by the current value, by sweeping the flux density or scanning the position of the aperture AP.

As described above, a mass spectroscope as described above comprises: a vacuum chamber (not shown) in which is arranged at least a chemical semiconductor substrate 1 of an electron beam detector 20; a separating section AZ that separates the ions that are generated from a sample (not shown) in this vacuum chamber in spatial or time-wise fashion in accordance with their mass; and a dynode DY1, DY2 that is irradiated with the ions that are separated by the separating section AZ: mass analysis of the aforesaid sample is conducted in accordance with the output of the electron beam detector 20 after directing to the electron beam detector 20 the secondary electrons e3 generated from the dynode DY1 or DY2 in response to incidence of ions on the dynode DY1 or DY2. Thus, in a mass spectroscope in which the electron beam detector 20 is adopted, the response speed of the light-emitting body 10 of the electron beam detector 20 is high, being of nsec order, so the mass analysis capability can be very greatly improved. Also, the light-emitting body 10 has an excellent persistence rate, so performance such as the life performance in this mass spectroscope is significantly improved.

The present invention is not restricted to the embodiment described above and can be modified in various ways. For example, the nitride semiconductor layer 14 may be partially of quantum well structure, or may be entirely of quantum well structure. Also, the photodetector 30, apart from being a photomultiplier, could be for example an avalanche photodiode (APD). Furthermore, the optical member 22 is not restricted to being of linear shape, but could be of curved shape, and its size also could be suitably altered.

Industrial Applicability

The present invention can be utilized in a light-emitting body that emits light in response to incidence of electrons, and an electron beam detector, scanning electron microscope or mass spectroscope using this.

The invention claimed is:

1. A light-emitting body that emits fluorescence in response to incidence of electrons said light-emitting body comprising:
    a substrate;
    a nitride semiconductor layer having a quantum well structure formed on one of faces of said substrate, said nitride semiconductor layer being comprised of $In_xAl_yGa_{1-x-y}N$ and $In_aAl_bGa_{1-a-b}N$,
    where,
        $x \leqq 1$,
        $y \leqq 1$,
        $x+ \leqq 1$,
        $a \leqq 1$,
        $b \leqq 1$,
        $a+b \leqq 1$;
    a cap layer formed on said nitride semiconductor layer, said cap layer having an electron incidence face, said cap layer being comprised of AlGaN; and
    a metal backing layer formed on the cap layer.

2. The light-emitting body according to claim 1, wherein said nitride semiconductor layer is comprised of InGaN and GaN.

3. The light-emitting body according to claim 1, wherein a thickness of said metal backing layer is at least 800 nm.

4. The light-emitting body according to claim 3, wherein a thickness of said cap layer is not more than 10 nm.

5. The light-emitting body according to claim 1, wherein a well width of the quantum well structure is not more than 4 nm.

6. An electron beam detector comprising the light-emitting body of claim 1.

7. The electron beam detector according to claim 6, further comprising a photodetector having sensitivity for the fluorescence generated by said light-emitting body.

8. A scanning electron microscope comprising:
    the electron beam detector of claim 7; and
    a vacuum chamber in which at least said light-emitting body is arranged,
    wherein an image of a sample is picked up by scanning a surface of the sample arranged in said vacuum chamber with an electron beam, thereby directing secondary electrons generated from the sample to said electron beam detector, and then correlating a scanning position of the sample and output of said electron beam detector.

9. A mass spectroscope comprising:
    the electron beam detector of claim 7;
    a vacuum chamber in which at least said light-emitting body is arranged;
    a separating section for separating in spatial or time-wise fashion the ions generated from a sample in the vacuum chamber in accordance with mass of the ions; and
    a dynode that is irradiated with ions separated by said separating section,
    wherein secondary electrons generated from said dynode in response to incidence of ions on said dynode are directed to the electron detector, and mass spectroscopy of the sample is performed from output of said electron beam detector.

* * * * *